United States Patent [19]
Quarton

[11] 4,038,668
[45] July 26, 1977

[54] APPARATUS FOR PRODUCING SMOOTH AND CONTINUOUS GRAPHIC DISPLAYS FROM INTERMITTENTLY SAMPLED DATA

[75] Inventor: William T. Quarton, Englewood, Colo.

[73] Assignee: Honeywell Inc., Minneapolis, Minn.

[21] Appl. No.: 627,794

[22] Filed: Oct. 31, 1975

[51] Int. Cl.$^2$ ............................................. G06G 7/30
[52] U.S. Cl. .................................... 235/151; 235/152; 340/324 AD; 346/110 R
[58] Field of Search ................ 346/110; 340/324 AD, 340/324 A; 235/152 IE

[56] References Cited
U.S. PATENT DOCUMENTS

| | | | |
|---|---|---|---|
| 3,459,926 | 8/1969 | Heilweil | 235/152 |
| 3,605,109 | 9/1971 | Tyler | 346/110 X |
| 3,686,662 | 8/1972 | Blixt | 340/324 A |

Primary Examiner—Joseph W. Hartary
Attorney, Agent, or Firm—Laurence J. Marhoefer; Lockwood D. Burton

[57] ABSTRACT

A display apparatus includes a computational circuit that is connected to the output of a memory to introduce between a stored digital representation of successive sampled data points, by an interpolation method, additional virtual or interpolated data points. The interpolated data points are computed in accordance with the magnitudes of the separations or differences in value between the sampled data points. In a CRT display or hard copy recorder, this allows a higher cathode ray sweep speed, and hence, a higher density of raster lines, and consequently, an improvement in resolution, smoothness and continuity of the display, for a given size memory.

2 Claims, 6 Drawing Figures

APPARATUS FOR PRODUCING SMOOTH AND CONTINUOUS GRAPHIC DISPLAYS FROM INTERMITTENTLY SAMPLED DATA

BACKGROUND OF THE INVENTION

1. Field of the Invention

This invention relates generally to the production of graphic displays of data signals, for example, analog physiological signals such as an electrocardiogram, and relates particularly to sampling type raster scan devices such as display cathode ray tubes or hard copy recorders wherein it is necessary to have a closely spaced raster for good resolution and smooth interconnection of the data points in order that the traces or curves being displayed may give the appearance of continuous lines.

2. Description of the Prior Art

Graphic display apparatus for providing single or multichannel analog displays and/or records of the amplitude variations of sampled analog data signals are known in the prior art. In one such known form of apparatus, the curves or traces, as plotted on the screen of a cathode ray tube (CRT), comprise a multitude of separated elements or dots instead of continuous lines or traces. Specifically, the plotting of such traces is effected by momentarily unblanking a normally blanked cathode ray beam at points along the successive scan or sweep paths which form the raster, depending upon the amplitudes of the sampled input analog data signals under measurement. Traces of this kind comprising many dots on the screen of the CRT obviously present difficulties in interpretation and analysis.

In another such known form of apparatus, graphic displays are produced from intermittently sampled analog data signals by a so-called connected sampling method that yields substantially continuous, and hence, more discernible curves, notwithstanding the intermittent nature of the sampled data from which the curves are produced. In this form of apparatus, the traces are obtained by producing successive substantially parallel lines on a display medium, for example, a photosensitive record sheet that is arranged to move past the face of a CRT that is operated in a line scan mode. Each of such lines extend between two points on each of the successive sweeps of the cathode ray beam. Between these two points the beam is unblanked. The positions of the points represent, respectively, a corresponding two, consecutively derived ones of the sampled data values. A requirement of this prior art apparatus is that a sampling and comparison step be performed for each sweep and displayed line constituting the trace. An example of a method and apparatus for producing such a connected sampling graphic display from intermittently sampled analog data is shown in U.S. Pat No. 3,605,109 that was issued on Sept. 14, 1971 to Peter R. Lowe and Tommy N. Tyler.

Display apparatus in which the variations in a sampled measured analog data value are converted to digital measured quantities which are stored in a suitable memory before being displayed is also known in the art. Such apparatus provides a display of the variations over a period of time of the analog data value. In such apparatus the sampled measured analog values are stored as individual digital values or data points in an image repeating or recirculating memory. An example of such an apparatus is shown in U.S. Pat. No. 3,653,027 that was issued on Mar. 28, 1972 to David W. Scheer. As there disclosed, an analog-to-digital converter is provided to produce the sampled derived to digital measured quantities. The digital information is recirculated in the memory at a much higher rate than that at which the measured digital values are entered into the memory. Blocks of information are read out of the memory at the memory recirculating frequency. The blocks of information, as read out, are converted back to analog form by a digital to analog converter, and are then presented to the circuit of a cathode ray tube through a comparing means. The cathode ray tube circuit includes a high speed vertical sweep signal and a low speed horizontal sweep signal means. A beam intensity or so-called Z-axis modulation means is activated when the comparing means senses a substantial equality between the analog signal to be displayed and a reference signal related to the high speed sweep signal. Specifically, a normally blanked cathode ray tube beam is unblanked momentarily, when a digital measured value is delivered from the memory, at a position along a vertical sweep or raster line dependent upon the value of the measured value. The representation of the variations in the analog data value appears upon the screen or face of the cathode ray tube as illuminated dots or light points.

A disadvantage of such prior art apparatus is that the dots or light points do not provide smooth and continuous traces or curves. Smoothing out of the traces or curves to make them appear more continuous could be accomplished by providing a raster with more closely spaced lines. While this is a possible solution, it is subject to a serious disadvantage. This is because of the requirement, with the prior art apparatus, even if the aforementioned connected sampling technique were employed, that each raster line must correspond to a data point in the digital memory. That is to say, with the prior art apparatus, the memory must store a data point or value for each raster line. Thus, the larger the number of raster lines that are provided, the larger the memory must be. Thus, the cost of the memory is increased in proportion to the number of raster lines. Since memory is expensive, the provision of more closely spaced raster lines to the known prior art apparatus to achieve smoother and continuous traces or curves has added significantly to the cost of the apparatus.

SUMMARY OF THE INVENTION

Accordingly, it is an object of the present invention to provide an improved method of and apparatus for producing a graphic display from intermittently sampled data, which apparatus yields smooth and continuous traces or curves that comprise faithful reproduction of the data notwithstanding the intermittent nature of the sampled data used as the information from which the curves are produced.

Another object of the invention is to provide an improved apparatus for providing a cathode ray tube display or hard copy record of high resolution from sampled data, comprising a faithful representation of the data, in which apparatus a one-to-one correspondence between raster lines and sampled data points in the memory is not required for high resolution, whereby for a given desired resolution fewer stored data points in the memory are required and a smaller and less expensive memory may be employed.

In accomplishing these and other objects, the apparatus of the present invention departs from the techniques employed in the prior art by introducing between sampled data points on the display or hard copy record, by an interpolation method, additional virtual data points which are computed in accordance with the magnitudes of the separations or differences in value between the sampled data points. By employing this interpolation method, it is possible to provide a higher density of raster lines and illuminated points for a memory of given capacity. The net result is an improvement in resolution, smoothness and continuity of display for a given memory capacity.

For convenience such virtual data points are also referred to herein as interpolated data points. When, for example, three interpolated data points are introduced between successively sampled data points, the density of the raster lines may be increased by a factor of four for the same number of sampled data points stored in the memory.

This data interpolation method is used where there is a fixed distance ($\Delta T$) between adjacent data points in the memory. The technique can be extended however, to variable distances between data points. As disclosed herein the interpolation method divides the vertical or Y distance between data points into four segments. As those skilled in the art will understand, however, the Y distance between data points may be divided into $2^n$ segments where $n = 1, 2, 4, \ldots$ to obtain the desired resolution.

The basic technique for effecting the interpolation can be accomplished either by a pre-programmed general purpose digital computer or by hard wired logic. An algorithm is provided for calculating the values of the interpolated segments. This algorithm basically comprises the calculation $\Delta Y = Y_2 - Y_1$, obtaining $\Delta Y/4$, and then adding $\Delta Y/4$ to $Y1$ four times, where $Y1$ is a first stored data point and $Y2$ is the next successive stored data point. This presentation is synchronized with the raster line generation in such a manner that the vertical positions of the illuminated interpolated line segments on the face of the cathode ray tube are in accordance with the relative amplitudes of the data end points, $Y_1$ and $Y_2$. The values of the data signals, including the interpolated signals, are presented to a comparator circuit arrangement for unblanking the beam of a CRT once during each vertical sweep or raster line for a time period related to the distance between the Y segment end points.

BRIEF DESCRIPTION OF THE DRAWINGS

A better understanding of the present invention may be had from the following detailed description when read in connection with the accompanying drawings wherein.

DESCRIPTION OF THE PREFERRED EMBODIMENT

Figure 1:
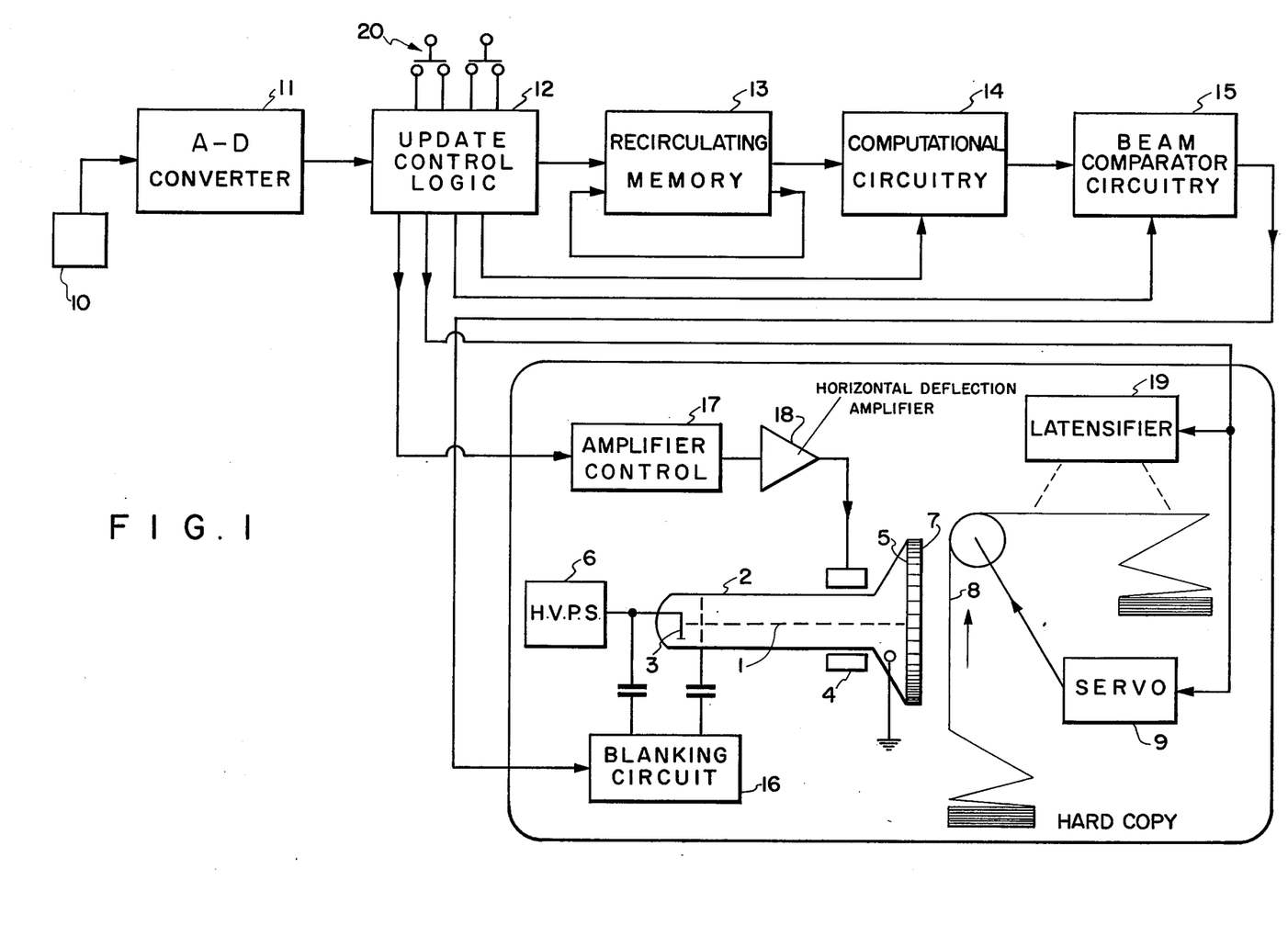
FIG. 1 is a diagram of a single channel display-producing apparatus according to the present invention operating according to the novel method thereof.

THE APPARATUS OF FIG. 1

FIG. 1 shows the path 1 of a cathode ray or electron beam of a CRT 2 that is operated on a line scan mode, a Z-axis modulation or beam intensity controlling cathode 3, horizontal deflection plates 4, a display screen 5 and a source of high voltage shown at 6. The CRt 2 also includes a fiber optics array or strip (not shown) that is inserted into the faceplate 7. A photosensitive record sheet 8 is advanced by a suitable servo shown at 9, at a predetermined rate upward, as seen in FIG. 1, past the fiber optics strip from a supply of the photosensitive record sheet.

An analog signal to be displayed, for example, an electrocardiogram signal derived from a sensing device shown at 10, is applied to an input terminal of an analog to digital (A-D) converter 11. A - D converter output is connected to suitable update control logic circuitry shown at 12 to the input of an image repeating or recirculating memory 13. The output of the recirculating memory 13, comprising 10 lines although not shown in FIG. 1, is connected to the input of interpolation computational circuitry shown at 14. The output of the computational circuitry 14 is connected to the input of a digital beam comparator circuit shown at 15. The output of the digital beam comparator circuit is applied to a blanking circuit shown at 16 for the cathode ray beam of the CRT 2.

Horizontal synchronizing pulses for causing repetitive sweeping of the cathode ray beam along the aforementioned fiber optics strip are supplied to the horizontal deflection plates 4 under the control of the update control logic circuitry 12. To that end, an output of circuit 12 is connected to the input of an amplifier control shown at 17. The output of amplifier control 17 is connected to the input of a horizontal deflection amplifier shown at 18. The output of the latter is connected to the horizontal deflection plates 4 of the CRT 2. The cathode ray or electron beam is repetitively swept by the horizontal deflection plates 4 along the fiber optics strip of the CRT 2. Normally, the cathode ray beam is blanked and unless unblanked the signals applied to the horizontal deflection plates ane not effective to produce marks or traces on the photosensitive sheet 8. The cathode ray beam is arranged to be selectively unblanked under the control of the blanking circuit 16 which, in turn, is controlled by the beam comparator circuit 15. A latensifier shown at 19 is provided to latensify the latent images produced on the photosensitive sheet 8, in a manner known in the art. The intensity of the radiation produced by the latensifier is controlled by the logic circuit 12 in accordance with the speed at which the photosensitive sheet 8 is moved past the face plate of CRT 2. As shown in FIG. 1, a manual control device, for example, a push button selector switch 20, is provided for the logic circuit to facilitate adjustment in the said speed of the photosensitive sheet 8.

While only a single channel is shown in FIG. 1, it will be understood that the CRT 2, which may be large screen CRT, may be employed to service a number of different channels of data sequentially. Information for this channel of data as well as for other channels, when provided, is stored in the recirculating memory 13 and is selectively played out responsively to signals applied thereto by the update control logic circuitry 12.

The block diagram of FIG. 1 shows the essential features required for one channel. The incoming data on the input of A - D converter 11 is digitized, for example, to 10 bit resolution, at a constant high rate which may be 7 Khz. This data goes into the update control logic circuitry 12 which outputs one word of data at a rate determined by the paper speed, and which may be as high as 700 Hz. or as low as several Hz., for example 3.5 Hz.

Words representing adjacent sampled data values in the memory 13 are applied to the input of the interpolation computational circuitry 14 at a rate demanded by the speed at which the photosensitive sheet 8 is moved past the faceplate of the CRT 2. The computational circuitry 14 is operative, in a manner described hereinafter, to calculate, at a rate determined by the paper speed, several successively increasing or decreasing values intermediate the last two values presented to its input by the recirculating memory 13. The last mentioned values including the calculated intermediate values are applied in sequence to the input of the beam comparator circuitry 15. The output of the latter is applied to the blanking circuit 16 and presented thereby to the beam controlling cathode of the CRT 2. At the same time, as noted, the horizontal axis is swept, desirably although not necessarily, in a linear fashion. The resulting path of the cathode ray beam of the CRT 2 and the display provided thereby is illustrated in FIG. 2 for a typical analog input signal applied to the input of A - D converter 11.

Figure 2:
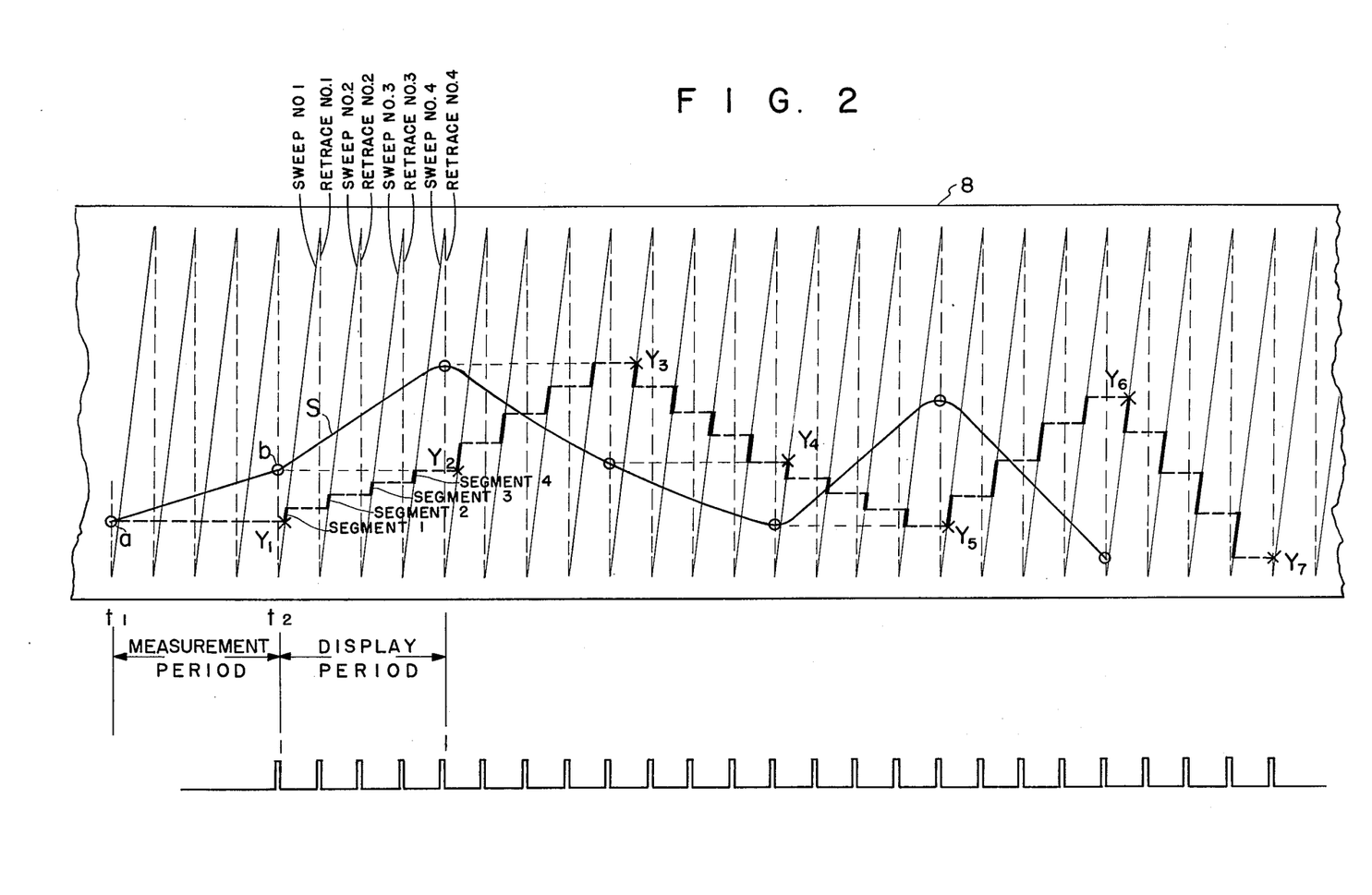
FIG. 2 is a representation which illustrates the nature of the curves produced according to the method and apparatus of the present invention.

THE REPRESENTATION OF FIG. 2

FIG. 2 shows the recording on photosensitive sheet 8 of the analog signal, applied by the device 10 to an input terminal of A - D converter 11, obtained by the recording technique according to the present invention. As seen in FIG. 2, the series of light solid lines identified as Sweep No. 1, Sweep No. 2, etc. represent successive scan or sweep paths of the cathode ray beam along the length of the fiber optics strip of CRT 2, assuming time to be increasing toward the right. The dash lines between the sweep paths, indentified as Retrace No. 1, Retrace No. 2, etc. represent the retrace, return, or flyback paths of the beam. For purposes of illustration, the lines have been shown with greatly exaggerated spacing along the time axis.

The heavy line indicated by the letter S in FIG. 2 represents the actual values of the analog data signal under measurement with respect to time, that is, the varying signal derived from the sensing device 10, as seen in FIG. 1. The line segments shown in heavy lines along Sweep Nos. 1 through 4 show the line segments produced on the screen of the CRT 2 as the electron beam is unblanked during the successive sweeps fo the beam. It is noted that these segments are produced in an indicating or display period that follows a measurement period in which the signal representing the data signal is measured. Thus the lowest value of the data signal at the time $t_1$ is shown as equal to the value at point $Y_1$ of the line segment along Sweep No. 1. The value $b$ of the data signal at time $t_2$ is shown as equal to the maximum value of the line segment along Sweep No. 4. The length of the line segments along each of Sweep Nos. 1 through 4 are each equal to one-fourth of the vertical distance between points $Y_2$ and $Y_1$. If the distance $Y_2 - Y_1 = \Delta Y$, then the length of the line segments is equal to $\Delta Y/4$, as shown in FIG. 2. This introduction of a plurality of line segments between the points Y1 and Y2 provides significantly better display resolution, as those skilled in the art will readily understand. Additionally, the introduction of the intermediate line segments contributes significantly to the smoothness and continuous appearance of the trace or curve formed by the successive line segments on the photosensitive sheet 8.

Figure 3:
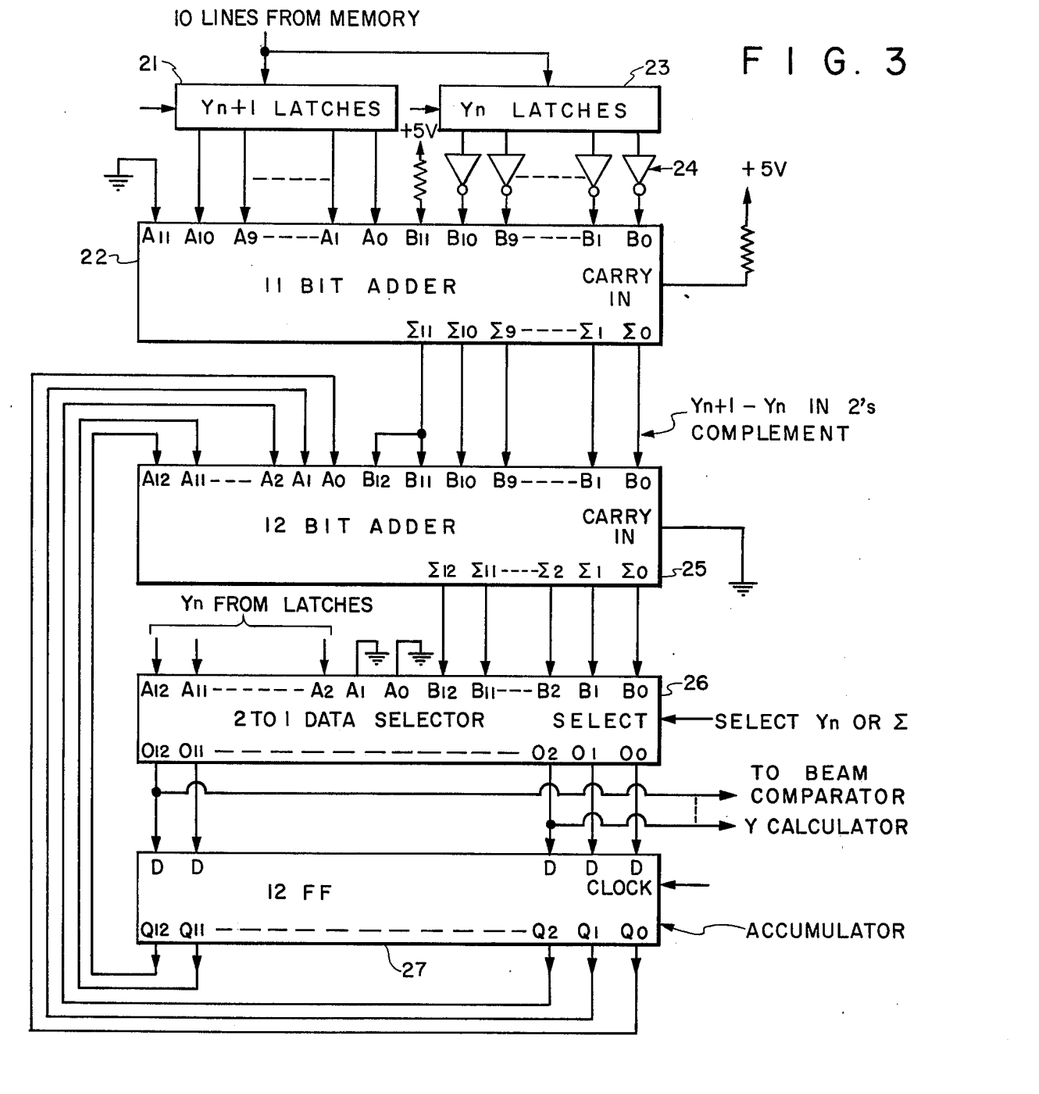
FIG. 3 shows a hard wired logic circuit for effecting the interpolation computations in the apparatus of FIG. 1.

THE COMPUTATIONAL CIRCUITRY OF FIG. 3

The circuit 14 of the FIG. 1 apparatus for effecting the interpolation computations is illustrated in hard wired form in FIG. 3. As seen in FIG. 3, ten lines from the output of the recirculating memory 13 are connected to the inputs of two sets of latches which are indicated generally at 21 and 23. Each set of latches includes ten latches each of which may be of D flip-flop form. The ten lines from the outputs of the latches indicated at 21 are connected to input terminals designated $A_0 - A_{10}$ of an 11 bit adder indicated at 22. The ten lines from the output of the latches indicated at 23 similarly are connected to the input terminals $B_0 - B_{10}$ of the adder 22. The ten lines from the latches 23 to the adder 22, however, each include an inverter. The inverters have been generally dsignated by the numeral 24.

The latches 21 are arranged to transmit to the adder 22 a digital representation of a first data point, for example, that designated $Y_2$ in FIG. 2, stored in the memory 13. Similarly, the latches indicated at 23 and the associated inverters 24 are arranged to transmit to the adder 22 a digital representation of an adjacent data point, for example that designated $Y_1$ in FIG. 2, stored in the memory 13. To this end, activating signals are sequentially applied to the sets of latches 23 and 21 in synchronism with the successive outputting by the recirculating memory 13 of the digital representations of adjacent data points. The activating signals are applied to the latches 23 and 21 and to the recirculating memory 13 from the update control logic circuitry 12.

The function of the apparatus of FIG. 3 is to respond to the digital representations outputted by the memory 13 of adjacent pairs of data points to produce a plurality of intermediate digital representations of data points intermediate each of said pairs of data points. Such intermediate digital representations comprise the aforementioned interpolated or virtual values. For convenience, the pairs of adjacent data points will hereinafter be referred to as $Y_n$ and $Yn+1$ and are so indicated in FIG. 3.

Figure 4:
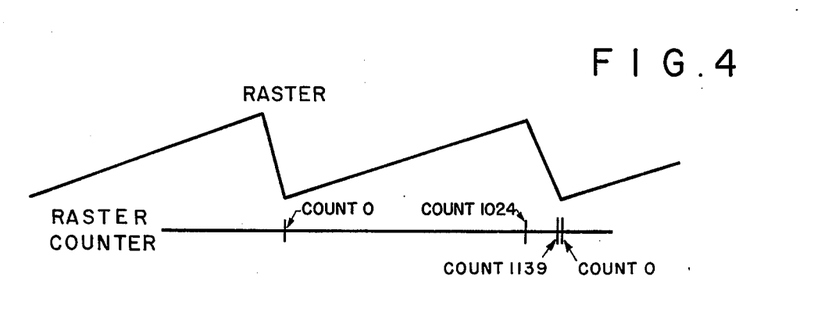
FIG. 4 is a diagram showing the clock timing for the beam comparator of FIG. 3.

The digital representation $Y_n$ is first stored in the latches 23 and then the digital representation $Yn+1$ is stored in the latches 21. Both of these storage operations and the outputting of information by the memory 13, are accomplished during a retrace period of the cathode ray beam 1 of CRT 2 when it has been determined, as hereinafter described, that new data points, and therefore, new interpolated line segments are desired. It will be seen by reference to FIGS. 2 and 4 that each of the successive line segments are produced during an individual sweep of the cathode ray beam. FIG. 4 shows the clock timing diagram for the beam comparator circuitry 15. Each such sweep is effected between counts 0 and 1023 of a divide by 1140 counter, not shown, but embodied in the update control logic circuitry 12. The said counter provides suitable activating signals to the latches 21 and 23 whereby the storage of the digital representations of $Y_n$ and $Yn+1$ and successive, new digital representations are stored in the respective latches 23 and 21 after every fourth sweep, during the retrace period, that is, between counts 1024 and 1139 of the counter. Count 1140 of the counter is a reset count for the counter. The digital representations of the data value pairs, $Y_n$ and $Yn+1$ remain stored in the latches during the display period for those data value pairs, that is, through four successive sweeps of the cathode ray beam. During the retrace period comprising counts 1024 through 1139 of the counter following each such display period, new values of adjacent data points, $Y_n$ and $Yn+1$ of the data stored in the recirculating memory are stored in the latches 23 and 21. These values, as noted, remain stored in the latches through four successive sweep periods, each comprising counts 0 through 1023 of the counter, and the times of the intermediate retrace periods, needed to display four line segments. This action is continually repeated.

In the operation of the FIG. 3 apparatus, the 11 bit adder 22 operates to subtract $Y_n$ from $Yn+1$ to determine the difference, designated $\Delta Y$, between the said two values. The 11 bit adder 22 may be of known type and provides the result of $Yn+1$ minus $Y_n$ in 2'scomplement. Adder 22 has the carry input set at a logical 1 to provide 2's complement subtraction. The 2's complement, as is known, provides a representation of the difference between $Yn+1$ and $Y_n$ in positive and negative values. Thus, $\Delta Y$ may be represented as a positive number or it may be a negative number. The 2's complement defines whether the number is positive or negative and also provides the value of the number.

As seen in FIG. 3, the summation output terminals $\Sigma 0$ through $\Sigma 11$ of the 11 bit adder 22 are applied to the $B_0$ through $B_{12}$ input terminals of a 12 bit adder indicated at 25. The $B_{11}$ and $B_{12}$ terminals of the adder 25 are connected together. The summation output terminals $\Sigma 0$ through $\Sigma 12$ of the adder 25 are connected to the input terminals $B_0$ through $B_{12}$ of a 2 to 1 data selector indicated at 26. The output from latches 23 is directly connected, that is, independently of the inverters 24, to the $A_2 - {_{A12}}$ inputs of the data selector 26. Thus, the digital representation of data point $Y_n$ is applied directly to the last mentioned inputs of the data selector 26. The output terminals $O_0$ through $O_{12}$ of the data selector 26 are connected to the input terminals of an accumulator indicated at 27. The latter comprises 12 flip flops. The output terminals $Q_0$ through $Q_{12}$ of the accumulator 27 are connected in a feedback manner to the input terminals $A_0$ through $A_{12}$ of the 12 bit adder 25. Additionally, as seen in FIG. 3, the output terminals $O_2$ to $O_{12}$ of the data selector 26 are connected to the input of the beam comparator circuitry 15.

Activating control signals are applied to the data selector 26 and the accumulator 27 from the update control logic circuitry 12. These signals are applied during the retrace periods of the cathode ray beam 1 of CRT 2, specifically between counts 1024 and 1139 of the divide by 1140 counter. Upon the assumption that the data selector is gating the output of adder 25 to the input of accumulator 27, then the adder 25 is adding $\Delta Y/4$ to what is in the accumulator. Clocking the accumulator 27 loads in what was previously in the accumulator plus $\Delta Y/4$. The carry input into adder 25 is held at logical '0', grounded, to provide normal addition.

By way of illustration and not by way of limitation, it is noted that the several components or devices shown in symbolic form in FIG. 3, may, if desired, be commercially available types offered by Texas Instruments as listed below:

| Latch 21 | Two Type SN74174 units |
|---|---|
| Latch 23 | Two Type SN74174 units |
| Adders 22, 25 | Three Type SN74283 units |
| Data Selector 26 | Three Type SN74157 units |
| Accumulator | Two Type SN74174 units |

Figure 5:
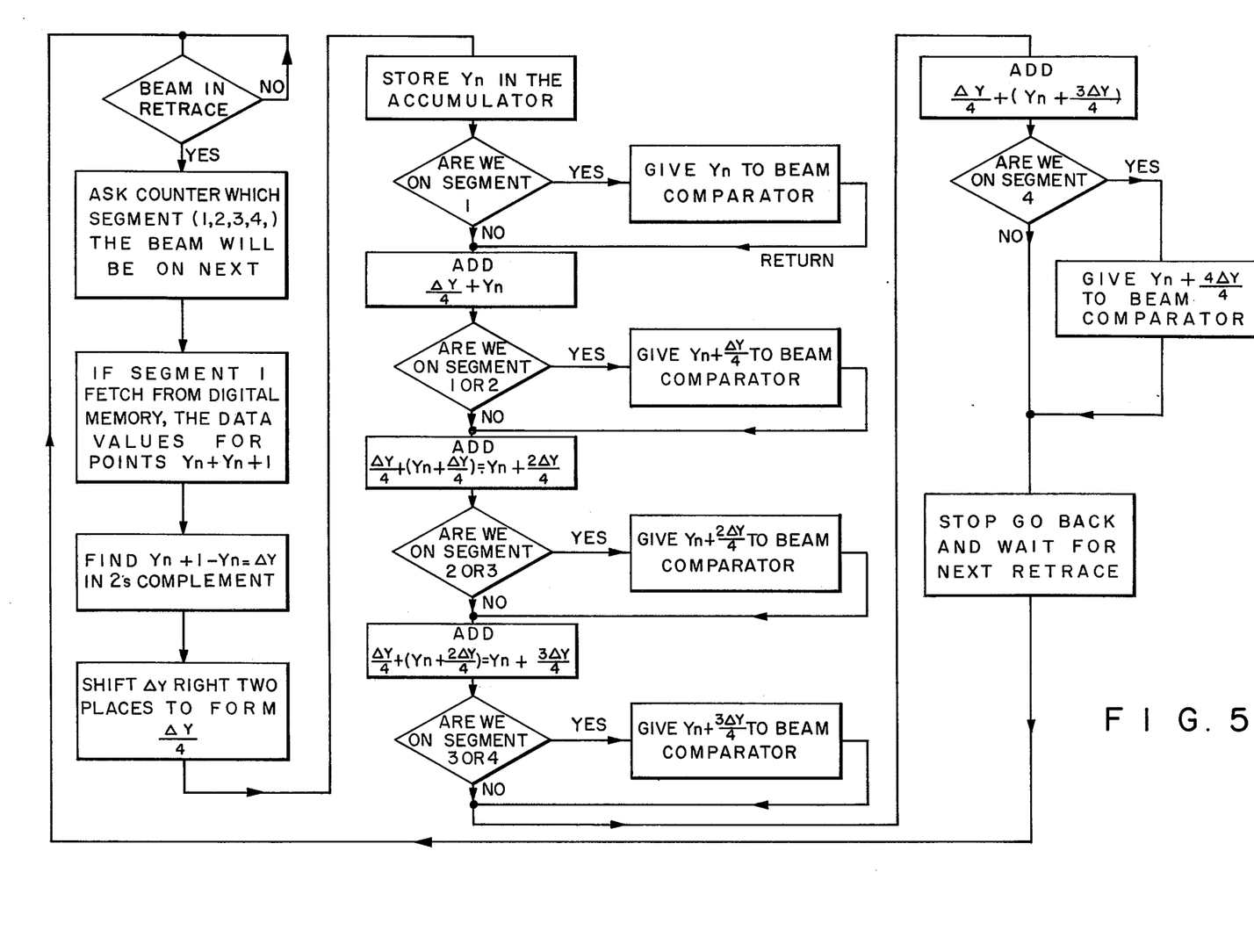
FIG. 5 is a flow chart illustrating the algorithm for the computational circuitry of the FIG. 1 apparatus.

THE Y-TRACE INTERPOLATOR ALGORITHM OF FIG. 5

Referring now to FIG. 5, there is shown a flow chart which illustrates symbolically the manner in which the computational circuitry 14 generates successive words representative of the intermittent and successive line segments $\Delta Y/4$ along the successive traces designaged Sweep Nos. 1 through 4, as is seen in FIG. 2. For convenience of illustration, the segments along the successive sweeps have been designated segment 1, segment 2, segment 3 and segment 4. As noted, all of the segments between the adjacent data points $Y_n$ and $Yn+1$ or between the data points $Y_1$ and $Y_2$, $Y_2$ and $Y_3$, as shown in FIG. 2 are of equal length. Thus, the segments during successive display periods may be similarly designated, and in any particular display period, the segments also are all of the same length. The actual length of the segments in different display periods will depend upon the vertical distance between the successive data points, for example, $Y_3 - Y_2$, $Y_4 - Y_3$, etc., as seen in FIG. 2.

Specifically, by reference to FIG. 5, it will be seen that the algorithm first inquires as to whether the counter of the update control logic circuitry 12 is in retrace, that is counts 1024 through 1139 of the divide by 1140 counter. If not, the apparatus illustrated in FIG. 3 waits until the said counter is in retrace. If the said apparatus is in retrace, the value of new line segments may require calculation. The next inquiry is to determine which segment (1, 2, 3 or 4) the beam will be on next. Having made a determination that the next such end segment is the first, the algorithm then provides for fetching from the recirculating digital memory 13 the data values for the points $Y_n$ and $Yn+1$. This results in the generation of a signal from the update logic circuitry 12 to provide the sequential outputting of the data signals $Y_n$ and $Yn+1$ from the memory 13 and their storage in the latches 23 and 21, respectively. From there they go into the 2's complement adder 22. The algorithm then provides for the determination of $Yn+1$ and $Y_n$ to provide $\Delta Y$ in 2's complement. This representation comes out of the adder 22. Following this determination and activation the algorithm specifies shifting $\Delta Y$ to the right two places to determine $\Delta Y/4$. This operation is performed by the hard wired inputs to the 12 bit adder 25. As is known, in binary notation, the shifting of a number to the right results in actual division of the number by two each time such a shift is made.

By reference to FIG. 3, it will be seen that the extreme right bit of $Y_n$ comes into terminal $B_0$ of adder 22 and comes out of $\Sigma$ 0. This bit continues on down to the output terminal on the extreme right of the data selector 26, as seen in FIG. 3. The digital word, however, that is fed to the beam comparator 15 is taken from the output terminal $O_2$ to the output terminal $O_{12}$ of the data selector 26. The two right hand bits $0_0$ and $0_1$ are omitted. Taking $Y_n$ applied to input terminals $A_2$ through $A_{12}$ of data selector 26, and having the $\Delta Y$ over at the right ten bits is equivalent to a shift to the right of two bits. $\Delta Y$ thus is shifted to the right by two places by the hard wiring into the 12 bit adder 25. The first value needed in the accumulator 27 is $Y_n$. This value can be added to the value $\Delta Y/4$. The way $Y_n$ is stored in the accumulator 27 is by means of the 2 to 1 data selector 26. Thus, as seen in FIG. 3 and as previously mentioned, the value $Y_n$, directly out of the latches 23, is connected into the input terminals $A_2$ through $A_{12}$ of the data selector 26. The connection of this digital representation is into the 10 left bits. The two right bits $A_O$ and $A_1$, are 0. This corresponds with the digital word that is to be applied to the beam comparator 15.

Having effected the storage of $Y_n$ in the accumulator, the next inquiry of the algorithm, as seen in FIG. 5, is the apparatus about to produce the first trace segment of a display period, that is, segment 1. If so, the digital word representing $Y_n$ is given to the beam comparator 15. Then the algorithm provides for the addition of $\Delta Y4$ to $Y_n$. The next inquiry is whether the apparatus is about to produce segment 1 or segment 2. If in the affirmative, the digital word for $Y_n + \Delta Y/4$ is given to the beam comparator. Next, the value $\Delta Y/4$ is added to the quantity $Y_n + \Delta Y/4$ to provide the digital representation for $Y_n + 2 \Delta Y/4$. Again, an inquiry is then made as to the trace segment that is about to be produced, namely, segment 2 or segment 3. If so, the digital word representing $Y_n + 2 \Delta Y/4$ is given to the beam comparator. Then the value $\Delta Y/4$ is added to the quantity $Y_n + 2 \Delta Y/4$ to provide the value $Y_n + 3\ 66\ Y/4$. A further inquiry as to the segment about to be produced is then made, that is, segment 3 or segment. 4. If affirmative, the digital word for the quantity $Y_n 3\Delta Y/4$ is given to the beam comparator. Then the value $\Delta Y/4$ is added to the quantity $Y_n + 3\Delta Y/4$ to provide the value $Y_n + 4\Delta Y/4$. An inquiry is then made as to whether the apparatus is about to produce segment 4. If the latter the digital word for the quantity $Y_n + 4\Delta Y/4$ is given to the beam comparator. Then, the algorithm provides for the stopping of further such inquiries and directs the apparatus to go back and wait for the next retrace period of the divide by 1140 counter.

Figure 6:
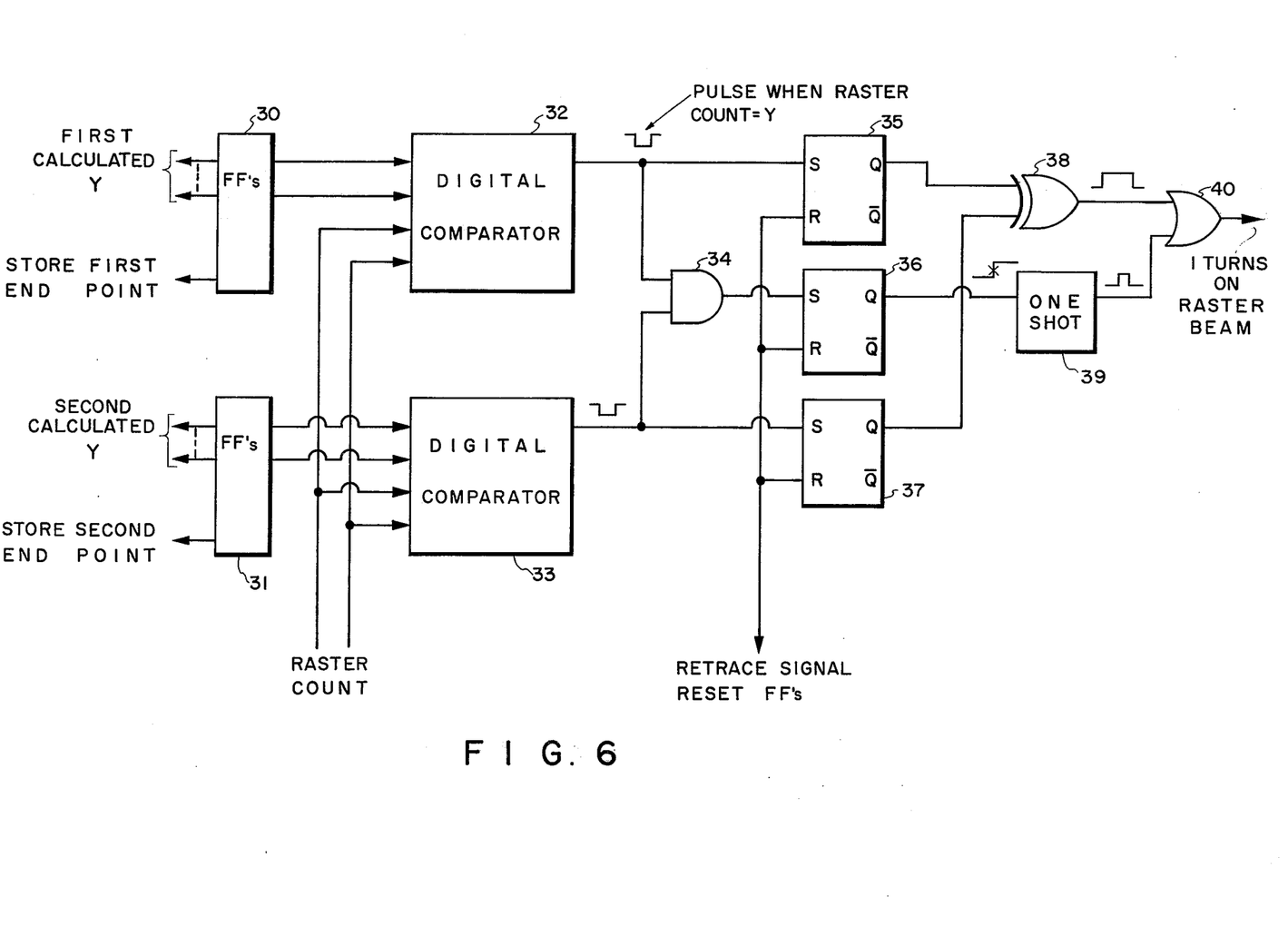
FIG. 6 illustrates the circuit for the digital beam comparator for the Y-trace data in the apparatus of FIG. 1.

THE BEAM COMPARATOR CIRCUIT OF FIG. 6

FIG. 6 shows the beam comparator circuit of the FIG. 1 apparatus. As shown, the circuit of FIG. 6 includes a first group of flip-flops 30, a second group of flip-flops 31, a first digital comparator 32, a second digital comparator 33, an AND gate 34, flip-flops 35, 36 and 37, an EXCLUSIVE OR gate shown at 38, a one-shot shown at 39, and an OR gate 40. The output of the OR gate 40 is connected to the blanking control circuit 16, as seen in FIG. 1.

Specifically, the circuit arrangement of FIG. 6 is operative to turn on the cathode ray beam of the CRT 2 when the vertical sweep or raster line as seen in FIG. 2 crosses the first Y value, and is operative to turn off the beam when the sweep line crosses the second Y value. If the two Y values are equal, the one-shot 29 momentarily turns on the beam when the common Y value is crossed.

The update control logic circuitry 12, as mentioned hereinbefore, includes a divide by 1140 counter, which provides, in addition to the signals previously mentioned, a signal that is in synchronism with the sweep signal applied to the deflection plates 4 of the CRT 2. This signal count is applied to the clock inputs of each of the digital comparators 32 and 33. Retrace signals also are applied from the control logic circuitry 12 to the reset terminals of the flip-flops 35, 36, and 37 to reset them. With this arrangement, the sweep of the cathode ray beam effectively is controlled by the counter. The sweeps respectively occur during counts 0 to 1024 of the counter and the beam repetitively is held in retrace for counts 1025 through 1139.

Thus, there has been provided, in accordance with the present invention, an apparatus for producing a faithful display of the variations in amplitude with time of an input data signal. To that end, the data signal is repetitively sampld to derive a succession of values each of which represents a successive amplitude condition of the signal, and successively and linearly interpolated amplitude conditions of the signal are derived and introduced between the said first mentioned successive amplitude conditions of the signal. The successive amplitude conditions of the signal including the interpolated conditions are used to produce substantially parallel line segments in each of individually associated sweeps of the cathode ray beam of the CRT. Each of such line segments so produced is substantially continuous whereby a smooth and continuous trace of the variations in amplitude of the input data signal derived from sensing device 10 is produced.

Also, there has been provided, in accordance with the present invention, an apparatus for producing a higher degree of resolution for the same size memory storage capacity than has been available with prior art apparatus. With the arrangement illustrated and described, the storage capacity of the recirculating memory may be smaller in size than that which would be required if the interpolating method and apparatus of the present invention were not employed. While the algorithm provided for calculating the values of the interpolated segments contemplates a division of $\Delta Y$ by four, and then adding $\Delta Y/4$ to Y1 four times, where Y1 is the first stored data point and Y2 is the next successive stored data point, it will be apparent to those skilled in the art that a different algorithm may be employed, as mentioned hereinbefore. For example, if an algorithm contemplating $\Delta Y$ to be divided by 8 were provided, such an algorithm would allow the storage capacity of the memory 13 to be one-eighth that of the prior art for the same degree or resoltuion, and would contribute even further to the smoothness of the trace or curve produced, within the restraints of the resolution of the CRT beam.

As those skilled in the art will readily understand, the interpolating technique of the present invention may be embodied in a CRT visual display arrangement as well as in the hard copy recording arrangement illustrated in FIG. 1. In the CRT visual display format the photosensitive sheet 8 and the servomotor drive mechanism would not be employed. Also, the CRT employed would not require the fiber optics strip of CRT 2. Vertical deflection plates as well as horizontal deflection plates would be required, however, for the CRT. Vertical deflection signals synchronized with the horizontal sweep signals would be required for the vertical deflection plates, as disclosed, for example, in said aforementioned U.S. Pat. No. 3,653,027. Such vertical deflection signals could be supplied by the update control logic circuitry 12. In a manner similar to that described in said U.S. Pat. No. 3,653,027, the data stored in the recirculating memory 13 would be continuously updated by new data. As a result the traces observed on the face of the CRT and representing the variations in the input data over a period of time would be seen to move across the face of the CRT. Alternatively, in a manner known in the art, new and old data may be made to remain stationary on the face of the CRT and a vertical bar made to move from left to right, for example, to erase old data and to replace it with new data. Desirably, the rate at which new data is made to replace old data (the update speed) may be controlled by an operator. To that end the update control logic circuitry would be provided with a suitable manually adjustable control component.

The embodiments of the invention in which an exclusive property or privilege is claimed are defined as follows:

1. Apparatus for producing a display of the condition of a signal comprising, a display means having a display medium, first means connected to the source of the signal for producing a succession of digital value representations, each of which represents a successive condition of the signal, and second means connected to said first means to derive from consecutively derived ones of said digital values other digital values intermediate of said consecutively derived ones said second means including a recirculating memory in which said succession of digital value representations are stored and which is arranged to output digital value representations of adjacent stored values of the condition of the signal, a computational circuit that is connected to the output of said memory and is responsive to the digital value representations produced at said output to produce digital representations of values of the condition of the signal intermediate said adjacent stored values, said computational circuit including first and second latch means connected to the output of said recirculating memory, the digital representations of the first occurring of said adjacent values being stored in the first one of said latch means, and the digital representation of the second occurring of said adjacent values being stored in a second one of said latch means, first and second adders, each of said adders having first and second sets of input terminals and a set of summation output terminals, the output of said second latch means being applied to said first set of input terminals of said first adder, inverting means, the output of said first latch means being connected through said inverting means to said second set of input terminals of said first adder, the summation output terminals of said first adder being connected to said first set of input terminals of said second adder, a data selector having first and second sets of input terminals and a set of output terminals, connections from the output of said first latch means to said first set of input terminals of said data selector, a connection from the summation output terminals of said second adder to said second set of input terminals of said data selector, an accumulator having input terminals and output terminals, a connection from the output terminals of said data selector to the input terminals of said accumulator, and a connection from the output of said accumulator to said second set of input terminals of said second adder and third means includes a digital comparator connected to the output of said data selector of said computational circuit, said digital comparator being operative to respond to the digital representations produced by said computational circuit to provide a succession of control signals, and display means controlled by said control signals to produce substantially parallel lines on said display medium, each of said lines being individually representative of a related one of said consecutively derived ones and said other values, all of said lines being substantially continuous and extending in their aggregate length between two points, the positions of which represent, respectively, a corresponding two, consecutively derived ones, of said values.

2. Apparatus as specified in claim 1 wherein said display means includes a cathode ray tube having a screen and means to produce a cathode ray beam, wherein said third means includes means to sweep said cathode ray beam across said screen, and wherein said third means includes further means selectively to blank and unblank the said cathode ray beam.

* * * * *